(12) United States Patent
Van Zwol et al.

(10) Patent No.: US 11,971,654 B2
(45) Date of Patent: Apr. 30, 2024

(54) METAL-SILICIDE-NITRIDATION FOR STRESS REDUCTION

(71) Applicant: ASML NETHERLANDS B.V., Veldhoven (NL)

(72) Inventors: Pieter-Jan Van Zwol, Eindhoven (NL); Adrianus Johannes Maria Giesbers, Vlijmen (NL); Johan Hendrik Klootwijk, Eindhoven (NL); Evgenia Kurganova, Nijmegen (NL); Maxim Aleksandrovich Nasalevich, Eindhoven (NL); Arnoud Willem Notenboom, Rosmalen (NL); Mária Péter, Eindhoven (NL); Leonid Aizikovitsj Sjmaenok, Vaals (NL); Ties Wouter Van Der Woord, Eindhoven (NL); David Ferdinand Vles, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/208,188

(22) Filed: Jun. 9, 2023

(65) Prior Publication Data
US 2023/0324786 A1 Oct. 12, 2023

Related U.S. Application Data

(63) Continuation of application No. 17/685,988, filed on Mar. 3, 2022, now Pat. No. 11,686,997, which is a continuation of application No. 16/761,683, filed as application No. PCT/EP2018/080075 on May 5, 2018, now Pat. No. 11,287,737.

(30) Foreign Application Priority Data

Nov. 6, 2017 (EP) ..................................... 17200069
Jun. 22, 2018 (EP) ..................................... 18179205

(51) Int. Cl.
*G03F 1/62* (2012.01)
(52) U.S. Cl.
CPC ..................................... *G03F 1/62* (2013.01)
(58) Field of Classification Search
CPC ....................................................... G03F 1/62
USPC ............................................................ 430/5
See application file for complete search history.

(56) References Cited

U.S. PATENT DOCUMENTS

| 6,623,893 | B1 | 9/2003 | Levinson et al. |
| 8,663,875 | B2 | 3/2014 | Okubo et al. |
| 10,228,615 | B2 | 3/2019 | Nikipelov et al. |
| 10,768,523 | B2 | 9/2020 | Nam |
| 2002/0058186 | A1 | 5/2002 | Nozawa et al. |
| 2002/0127477 | A1 | 9/2002 | Levinson et al. |
| 2012/0034552 | A1 | 2/2012 | Okubo et al. |
| 2017/0205704 | A1 | 7/2017 | Nikipelov et al. |
| 2017/0285461 | A1 | 10/2017 | Okubo et al. |
| 2019/0011828 | A1 | 1/2019 | Van Zwol et al. |

FOREIGN PATENT DOCUMENTS

| EP | 2423747 | 2/2012 |
| JP | 2011-100016 | 5/2011 |
| KR | 10-2017-0029556 | 3/2017 |
| TW | 201727354 | 8/2017 |
| TW | 201736941 | 10/2017 |
| WO | 2013152921 | 10/2013 |
| WO | 2017036944 | 3/2017 |
| WO | 2017076686 | 5/2017 |
| WO | 2017102383 | 6/2017 |

OTHER PUBLICATIONS

International Search Report and Written Opinion issued in corresponding PCT Patent Application No. PCT/EP2018/080075, dated Mar. 27, 2019.
Netherlands Office Action and Search Report issued in corresponding Netherlands Patent Application No. 2023840, dated Mar. 18, 2020.
Goldfarb, Dario L.: "Fabrication of a full size EUV pellicle based on silicon nitride", Proc. of SPIE, vol. 9635, Oct. 23, 2015.
Claassen, W.A.P., et al.: "Characterization of Plasma Silicon Nitride Layers", Journal of the Electrochemical Society, vol. 130, No. 12, Dec. 1, 1983.
Karouta, Fouad, et al.: "Structural, compositional and optical properties of PECVD silicon nitride layers", Journal of Physics, vol. 45, No. 44, Oct. 10, 2012.
Van Zwol, P.J., et al.: "Pellicle films supporting the ramp to HVM with EUV", Proc. of SPIE, vol. 10451, Oct. 16, 2017.
International Search Report and Written Opinion issued in corresponding PCT Patent Application No. PCT/EP2018/080075, dated May 22, 2020.

(Continued)

*Primary Examiner* — Christopher G Young
(74) *Attorney, Agent, or Firm* — Pillsbury Winthrop Shaw Pittman, LLP (57) ABSTRACT

A pellicle for a lithographic apparatus, the pellicle including nitridated metal silicide or nitridated silicon as well as a method of manufacturing the same. Also disclosed is the use of a nitridated metal silicide or nitridated silicon pellicle in a lithographic apparatus. Also disclosed is a pellicle for a lithographic apparatus including at least one compensating layer selected and configured to counteract changes in transmissivity of the pellicle upon exposure to EUV radiation as well as a method of controlling the transmissivity of a pellicle and a method of designing a pellicle.

20 Claims, 5 Drawing Sheets

(56) References Cited

OTHER PUBLICATIONS

Netherlands Office Action issued in corresponding Netherlands Patent Application No. 2025951, dated Sep. 16, 2020.
Office Action issued in corresponding Taiwanese Patent Application No. TW107139309, dated Mar. 18, 2022.
Office Action issued in corresponding Japanese Patent Application No. 2020-523320, dated Apr. 4, 2023.
Office Action issued in corresponding Korean Patent Application No. 10-2020-7012926, dated Dec. 13, 2023.
Office Action issued in corresponding Chinese Patent Application No. 201880071768, dated Dec. 29, 2023.

METAL-SILICIDE-NITRIDATION FOR STRESS REDUCTION

This application is a continuation of pending U.S. patent application Ser. No. 17/685,988, filed Mar. 3, 2022, which is a continuation of U.S. patent application Ser. No. 16/761,683, filed May 5, 2020, now U.S. Pat. No. 11,287,737, which is the U.S. national phase entry of PCT Patent Application No. PCT/EP2018/080075, filed Nov. 5, 2018, which claims the benefit of priority of European Patent Application No. 17200069.7, filed Nov. 6, 2017, and of European Patent Application No. 18179205.2, filed Jun. 22, 2018, each of the foregoing applications is incorporated herein in its entirety by reference.

FIELD

The present description relates to a pellicle for a lithographic apparatus, a method of manufacturing a pellicle for a lithographic apparatus, and a lithographic apparatus comprising a pellicle, as well as uses therefor.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus includes a patterning device (e.g. a mask or reticle). Radiation is provided through or reflected off the patterning device to form an image on a substrate. A pellicle may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters. Due to the sometimes harsh environment inside a lithography apparatus, particularly an EUV lithography apparatus, pellicles are required to demonstrate excellent chemical and thermal stability.

Known pellicles may comprise, for example, a freestanding graphene membrane, graphene derivative, including graphene halides, graphane, fullerene, carbon nanotube, or other carbon-based material. A mask assembly may include the pellicle which protects a patterning device (e.g. a mask) from particle contamination. The pellicle may be supported by a pellicle frame, forming a pellicle assembly. The pellicle may be attached to the frame, for example, by gluing a pellicle border region to the frame. The frame may be permanently or releasably attached to a patterning device. The freestanding graphene membrane may be formed by floating a thin film of graphene on a liquid surface and scooping the thin film onto a silicon frame. The quality of membranes formed in this way has been found to be variable and difficult to control. Furthermore, it is difficult to produce large graphene membranes reliably.

It has been found that the lifetime of known pellicles, such as pellicles comprising freestanding graphene membranes or other carbon-based membranes, is limited.

It has also been found that known pellicles may be etched in an atmosphere which contains free radical species, such as H* and HO*, and thereby can degrade over time with use. Since pellicles are very thin, the reaction with the free radical species can weaken the pellicle and ultimately cause it to fail. Alternative materials for use as pellicles are therefore required.

In addition, it has been found that the transmissivity of a pellicle can vary over time. This affects the amount of radiation which is able to pass through the pellicle and may therefore cause under- or over-exposure of the resist used in the lithographic apparatus. Also, if the transmissivity decreases, this can lead to the pellicle operating at a higher temperature than would otherwise be the case, which can lead to damage to the pellicle and a reduction in the lifespan of the pellicle. Alternative pellicles which are less susceptible to changes in transmissivity during use are therefore desirable.

Refractory metal silicides such as molybdenum disilicide, niobium disilicide, tantalum disilicide, and tungsten disilicide, have been investigated for use as gate materials, ohmic contacts, and heating elements due to their chemical and thermal stability and their electrical conductivity. Until the present embodiments, it has not been possible to use such materials as pellicles.

Metal silicide compounds may be used for transistor gates. These may be formed by depositing a layer of the metal silicide compound on a silicon wafer. The metal silicide layer or film may be deposited on the silicon by vapor deposition techniques, such as physical vapor deposition (PVD) or chemical vapor deposition (CVD). In the deposition step, a refractory metal having a high melting point, such as molybdenum, is deposited on a silicon wafer, where it reacts to form a metal silicide layer. The metal silicide layer may be provided with a sacrificial layer of silicon or silicon oxide in order to protect the metal silicide layer. Such layered materials have been used in semiconductor devices for reducing the electrical resistance of silicon gate electrodes or silicon wiring layers formed on a semiconductor substrate or source and drain regions or diffused wiring layers formed in a major surface of a semiconductor substrate of single crystal silicon to as low as possible.

However, it has been found that such materials as are known in the semiconductor industry for use in microelectronics are unsuitable for use as pellicles. It will be appreciated that pellicles are much larger than microelectronic chips and are subject to much harsher operating conditions. In addition, the electronic properties of such materials are of primary importance when used in microelectronics, but it is the physical properties which are more important when used as a pellicle. Further, it has not previously been possible to manufacture metal silicide films which are larger than around 1 cm by 1 cm, and so known metal silicide films are unable to be used as pellicles.

In conventional manufacturing of freestanding metal silicide films, the film is heated to around 900° C. or more to allow the film to anneal. The annealing allows the metal silicide to find the lowest stress state at that particular temperature and to increase the density of the metal silicide film. When allowed to cool, the metal silicide shrinks more than the silicon substrate (e.g. a silicon wafer) on which the metal silicide film is grown, which results in high tensile stresses in the metal silicide layer after cooling. In order to recover the metal silicide layer, the remainder of the wafer is etched away. The metal silicide layer floats in the etchant and is able to be recovered. However, the high tensile stresses within the metal silicide film are retained.

Without wishing to be bound by scientific theory, it is believed that metal silicide films formed in this way are unable to be grown to more than 1 cm by 1 cm area due to the stresses caused by the mismatch between the coefficients of thermal expansion of the silicon substrate and the metal silicide film. In particular, the metal silicide films expand more than the silicon substrate when heated and shrinks more when cooled down, resulting in high tensile stresses in the metal silicide layer.

It is necessary to anneal the metal silicide layer in order to densify the metal silicide layer. If annealing is not done before the material is used as a pellicle in the lithographic apparatus, then the material would densify and shrink when the material is heated during exposure in the lithography apparatus. This would result in high tensile stresses in the material and probable failure of the pellicle.

Another reason for exposing the pellicle film to high temperatures is to allow the deposition of high quality sacrificial oxides. The deposition of the sacrificial oxide layer is to allow the release of the ultrathin pellicle film. Pinholes in the sacrificial oxide layer are avoided by deposition of the sacrificial oxides at high temperatures. As such, the deposition of sacrificial oxides required for pellicle release introduces high temperatures into the manufacturing process. The sacrificial oxide may be provided by the decomposition of tetraethyl orthosilicate (TEOS). At temperatures above around 600° C., TEOS decomposes into silicon dioxide and diethyl ether.

In practice, a metal silicide layer is deposited on the surface of a monocrystalline silicon wafer. The wafer is then annealed, which may be achieved by heating to a temperature around 400 to 600° C., such as 500° C. The pellicle is then heated to a minimum temperature of around 725° C. or more, desirably a minimum of around 750° C., to allow the sacrificial oxides such as TEOS and thermal oxide to decompose and stabilize the metal silicide layer. These temperatures induce a large tensile stress of around 0.5 to 1.5 GPa, for example 1 GPa in the metal silicide film. The silicon wafer is desirably a monocrystalline silicon wafer, but germanium wafers or wafers made from other materials that are suitable for EUV transmission may also be used.

Whilst such films have good density, the tensile stress is too high and they are therefore unable to be grown large enough to be used as pellicles in a lithographic apparatus and are otherwise unstable due to the high internal stresses.

It is therefore desirable to provide a method for manufacturing a pellicle which allows the manufacture of metal silicide films that are large and stable enough to be used as pellicles, desirably in lithographic apparatus, particularly EUV lithographic apparatus. It is also desirable to provide a pellicle which is thermally and chemically stable, and which is stronger than known metal silicide materials.

Whilst the present application generally refers to pellicles in the context of lithography apparatus, in particular EUV lithography apparatus, embodiments of the invention are not limited to only pellicles and lithography apparatus, and it is appreciated that the subject matter of the present invention may be used in any other suitable apparatus or circumstances.

For example, the methods herein may equally be applied to spectral purity filters. EUV sources, such as those which generate EUV radiation using a plasma, in practice do not only emit desired 'in-band' EUV radiation, but also undesirable (out-of-band) radiation. This out-of-band radiation is most notably in the deep UV (DUV) radiation range (from 100 to 400 nm). Moreover, in the case of some EUV sources, for example laser produced plasma EUV sources, the radiation from the laser, usually at 10.6 microns, may also form a significant source of undesirable (out-of-band) infrared (IR) radiation.

In a lithographic apparatus, spectral purity is desired for several reasons. One reason is that resist is sensitive to out of-band wavelengths of radiation, and thus the image quality of exposure patterns applied to the resist may be deteriorated if the resist is exposed to such out-of-band radiation. Furthermore, out-of-band infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A typical spectral purity filter may be formed, for example, from a silicon membrane that is coated with a reflective metal, such as molybdenum or ruthenium. In use, a typical spectral purity filter might be subjected to a high heat load from, for example, incident infrared and EUV radiation. The heat load might result in the temperature of the spectral purity filter being above 800° C., which results in eventual delamination of the coating. Delamination and degradation of the silicon membrane is accelerated by the presence of hydrogen, which is often used as a gas in the environment in which the spectral purity filter is used in order to suppress debris (e.g. molecular outgassing from resists, or particles debris or the like), from entering or leaving certain parts of the lithographic apparatus.

Thus, a metal silicide film according to an embodiment of the invention may be used as a spectral purity filter to filter out undesired radiation, and it may also be used as a pellicle to protect a lithographic mask from being contaminated with particles. Therefore, reference in the present application to a 'pellicle' is also reference to a 'spectral purity filter' (the terms may be interchanged). Although reference is primarily made to pellicles in the present application, all of the features could equally be applied to spectral purity filters. It is understood that spectral purity filters are a type of pellicle.

In a lithographic apparatus (and/or method) it is desirable to minimize the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimize the amount of undesirable radiation (e.g. out-of-band) radiation that is passing through the lithographic apparatus and which is incident upon the substrate. Furthermore, it is desirable to ensure that a pellicle used in a lithographic method or apparatus has an adequate lifetime, and does not degrade rapidly over time as a consequence of the high heat load to which the pellicle may be exposed, and/or the hydrogen (or the like, such as free radical species including H* and HO*) to which the pellicle may be exposed. It is therefore desirable to provide an improved (or alternative) pellicle, and for example a pellicle suitable for use in a lithographic apparatus and/or method.

Furthermore, whilst the present application generally refers to molybdenum disilicide pellicles, it will be appreciated that any suitable metal silicide materials may be used. For example, the pellicle may comprise zirconium, niobium, lanthanum, yttrium, and/or beryllium disilicides. In addition, embodiments of the invention relating to a pellicle having at least one sacrificial layer which is selected and configured to counteract changes in the transmissivity of the pellicle upon exposure to EUV radiation and the associated methods may be applied to pellicles comprising nitridated metal silicide or nitridated silicon, or may be applied to any other type of pellicle.

SUMMARY

The present description has been made in consideration of the aforementioned problems with known pellicles and known methods of producing and designing pellicles.

According to a first aspect, there is provided a pellicle for a lithographic apparatus, wherein the pellicle comprises nitridated metal silicide or nitridated silicon.

It has been surprisingly found that the addition of nitrogen to the metal silicide results in numerous advantages over metal silicide or silicon layers, wafers, films or similar which do not comprise nitrogen. These advantages make it possible to provide a pellicle comprising a metal silicide film, which has not previously been possible. The metal silicide substrate may be a molybdenum silicide or a zirconium silicide substrate.

By nitriding a metal silicide substrate, nitrogen is able to react with the metal silicide and form metal-silicide-nitride on a pellicle substrate. The metal-silicide-nitride layer may be formed on a silicon substrate, which may be a silicon wafer. Similarly, it is possible to dope pure silicon with nitrogen in order to improve the strength of a polysilicon pellicle. In this case, the substrate is substantially pure silicon.

Firstly, the addition of nitrogen has been surprisingly found to keep the film more amorphous than is the case without the additional nitrogen. This results in increased strength, resistance to heat, and resistance to mechanical loads, which is demonstrated by improved tensile strength.

In addition, the addition of nitrogen keeps the metal silicide film in a more compressive state during the annealing process. As such, as the metal silicide nitride film is cooled to room temperature, the film contracts to a lower extent than would otherwise be the case and there is consequently a lower residual tensile stress within the film at room temperature. Further, the film will be kept at a zero-state density and without the stress accumulation during high power exposures, which lead to high temperatures of around 450° C. to 600° C. In particular, the pellicle will not shrink when heated as the addition of nitrogen causes the pellicle to already be dense when it is deposited, thereby becoming more resistant to density changes during use.

Further surprising advantages due to the inclusion of nitrogen are the reduction in oxidation of the metal-silicide and the reduction in native oxide thickness. The reduction in susceptibility to oxidation improves the chemical and thermal stability of the metal silicide and the reduction in the native oxide thickness reduces the stresses on the metal silicide. Without wishing to be bound by scientific theory, it is believed that the native oxide layer introduces compressive stress and therefore exerts a tensile force on the pellicle film, thus weakening the film. The reduction in the thickness of the native oxide layer is believed to reduce the tensile stress. The reduction in native oxide thickness also aids in improving EUV transmission. It is important that as much of the EUV radiation available is able to pass through the pellicle without being absorbed in order to avoid reducing the power of the EUV radiation and thereby decreasing the efficiency of the apparatus as a whole and reducing the throughput of the apparatus.

The addition of nitrogen to the metal silicide layer has also been found to reduce the coefficient of linear thermal expansion of the material. This leads to lower tensile stresses in the material caused by changes in temperature, again leading to reduced tensile stresses and thereby allowing a larger film to be produced.

Similar advantages are also seen with a nitrided silicon pellicle.

Desirably, the metal silicide nitride has the formula $M_x(Si)_yN_z$, wherein $x \leq y \leq 2x$, and $0 < z \leq x$. The exact amount of nitrogen added can be adjusted depending on the nature of the metal in the compound as well as the operating conditions intended for the pellicle. For example, it is possible to include a higher amount of nitrogen in a zirconium silicide compound compared to a molybdenum silicide compound since zirconium is more transparent to EUV radiation than molybdenum and so, although an increase in the amount of nitrogen reduces EUV transmission, this is balanced by the improved transmissivity of the zirconium.

Accordingly, there is a larger atomic concentration of silicon than metal in the metal-silicide-nitride film. Desirably, the atomic concentration of silicon is around twice that of the metal, namely $y=2x$. It will be appreciated that non-stoichiometric values are possible. For example, the value of y may be any number between x and 2x, including x and 2x.

Since the presence of nitrogen is necessary in order to provide the metal silicide film with the desired physical characteristics, the value of z is greater than zero. Since the addition of nitrogen reduces the electrical conductivity of the metal silicide material at high concentrations, and also since the EUV transmissivity decreases at high nitrogen concentrations, it is desirable to keep the nitrogen content as low as possible in the metal silicide layer, but high enough to demonstrate the aforementioned advantages. It has been found that having x as less than one does not adversely affect EUV transmissivity, but provides the mechanical advantages described herein. As such, the value of z is less than or equal to the value of x. Desirably, the value of z is 1 or less.

Desirably, the nitridated silicon has the formula $SiN_a$, wherein $0.01 \leq a \leq 1$. Desirably, $a \leq 0.5$, and more desirably $a \leq 0.1$. While nitrogen doped silicon is known for use in microelectronics, the highest amount of nitrogen in doped silicon is around one nitrogen atom per ten thousand silicon atoms, i.e. 0.01 atomic %. In the present context, this would mean that the maximum value of 'a' was 0.0001. In lightly doped silicon, the value of 'a' would be orders of magnitude smaller. Further, in silicon nitride ($Si_3N_4$) there is a greater proportion of nitrogen atoms than silicon atoms, i.e. 'a'>1. As such, the formula of the pellicle falls outside that used in microelectronics and also when silicon nitride is used as a bulk material in, for example, bearings or turbochargers.

The formula of the material comprising the pellicle does not have to be stoichiometric. The formula is to be interpreted as having been reduced to the lowest common denominator and/or shown in a shortened format. For example, where the formula of the film is $Mo_2Si_4N_1$, this can also be expressed as $MoSi_2N_{0.5}$. In another example, where the formula of the film is $Zr_3Si_6N_1$, this may also be expressed as $ZrSi_2N_{0.33}$. Indeed, since the silicon is only being partially nitridated, the formula will not be stoichiometric.

Desirably, the metal (M) is selected from the group comprising Ce, Pr, Sc, Eu, Nd, Ti, V, Cr, Zr, Nb, Mo, Ru, Rh, La, Y, and Be. Desirably, the metal (M) is Mo or Zr or Be.

Exemplary compositions of the pellicle are $ZrSi_2N$, $MoSi_2N$, $LaSi_2N$, and $YSi_2N$. In each of these examples, x=1, y=2, and z=1.

Other exemplary compositions are $Mo_2Si_4N$, $Zr_2Si_4N$, $Mo_3Si_6N$, and $Zr_3Si_6N$. As can be seen from these examples, the atomic concentration of nitrogen is less than the atomic concentration of the metal. Desirably, the atomic concentration of nitrogen is less than around 25% of the total atomic concentration of metal, silicon, and nitrogen. As such, the metal and silicon desirably comprise more than around 75% of the total number of metal, silicon and nitrogen atoms in the metal silicide film. In other terms, more than around 75% of the total atoms in the metal-silicide-nitride pellicle are metal or silicon atoms, with the remaining around 25% being nitrogen atoms.

The atomic concentration of nitrogen may be less than around 20%, less than around 15%, less than around 10%, less than around 5%, or less than around 1%.

The pellicle may further comprise at least one capping layer. The pellicle may comprise a capping layer on each side of the metal-silicide-nitride or nitridated silicon film. The metal-silicide-nitride or nitridated silicon film may be from 10 to around 40 nm thick, desirably from around 15 to around 30 nm. The at least one capping layer may be around 0.1 to around 10 nm thick, desirably around 1 to around 5 nm thick. The capping layer may comprise any suitable capping material. Suitable capping materials are ones which are thermally and chemically stable in the environment of an EUV lithography apparatus and which do not significantly inhibit EUV transmission through the pellicle. The capping layer must also be compatible with the pellicle so that it is able to adhere to the nitridated metal silicide or silicon. Suitable coating materials include ruthenium Ru, boron B, metal borides, carbon boride B4C, boron nitride BN, or similar.

The capping material can be applied using any suitable method, such as, for example, chemical vapor deposition or sputtering.

In practice, the $M_xSi_yN_z$ may be manufactured at ambient temperatures on a wafer. The wafer may then be etched in a suitable liquid and the pellicle film may be lifted out of the liquid onto a frame. In this case, the addition of the nitrogen primarily increases the density of the film and therefore heat resistance. This may be used to produce EUV filters for various applications. $M_xSi_yN_z$ may also be manufactured using a CMOS (Complementary Metal Oxide Semiconductor) process which incorporates a high temperature anneal, and high temperature deposition of sacrificial oxides. The lower coefficient of thermal expansion due to the addition of nitrogen and enhanced resistance to structural changes due to the addition of nitrogen mainly serve to reduce stress and allow the manufacture of full-size pellicles.

According to a second aspect described herein, there is provided a method of manufacturing a pellicle for a lithographic apparatus, the method comprising nitriding a metal silicide or silicon substrate.

The nitriding of the metal silicide or silicon is effected by sputtering the metal silicide or silicon substrate with a plasma. The sputtering may be reactive sputtering. The plasma may be any suitable plasma. The plasma desirably comprises nitrogen. Desirably, the plasma comprises a mixture of argon and nitrogen gas. The argon gas is included in order to provide an inert atmosphere. Argon is desirably used as it is cheaper than other noble gases, but other noble gases could be used.

The ratio of argon to nitrogen may be varied. Having a larger proportion of nitrogen in the gas mixture will result in a greater amount of nitrogen being incorporated into the metal silicide film. For example, where the nitrogen flow ratio, which is calculated as the amount of nitrogen divided by the amount of nitrogen plus argon, was around 10%, this resulted in an atomic concentration of around 18% of nitrogen in the metal silicide nitride film. When the nitrogen flow ratio was around 40%, the resulting atomic concentration of nitrogen of around 42% in the metal silicide nitride film. Similarly, as the nitrogen flow ration was increased from 10% to 40%, there was a corresponding decline in the atomic concentration of oxygen from around 34% to around 15%, demonstrating the reduction in thickness of the native oxide layer. As such, the ratio of argon to nitrogen may be varied depending on the degree of nitridation required.

The metal forming the metal silicide may be selected from the group comprising Ce, Pr, Sc, Eu, Nd, Ti, V, Cr, Zr, Nb, Mo, Ru, Rh, La, Y, and Be. Of this group, molybdenum, zirconium, and beryllium are preferred elements. Molybdenum is most preferred.

Due to the limitations of known methods for producing pellicles, until now, there has been no suitable way of making a pellicle comprising metal silicide.

Nitridated metal silicide materials have previously only been used to form gates in semiconductor transistors, which are degrees of magnitude smaller than pellicles and do not have to withstand the harsh thermal and chemical environment of a lithography apparatus, particularly an EUV apparatus.

Thus, according to a third aspect, there is provided a pellicle for a lithographic apparatus obtainable or obtained by the method according to the second aspect.

According to a fourth aspect, there is provided the use of a pellicle manufactured by the method according to the second aspect or a pellicle according to the first aspect in a lithographic apparatus.

Since it has not previously been possible to manufacture a metal silicide pellicle having the required physical characteristics required for use as a pellicle, it has not been possible to use such a pellicle in a lithographic apparatus. Furthermore, it has been surprisingly realized that nitridating silicon can result in an increase in strength of the silicon pellicle.

According to a fifth aspect, there is provided the use of reactive sputtering to manufacture a pellicle according to the first aspect.

According to a sixth aspect, there is provided an assembly for a lithographic apparatus comprising a pellicle according to the any of the aforementioned aspects, a frame for supporting the pellicle and a patterning device attached to the frame.

According to a seventh aspect, there is provided a pellicle for a lithographic apparatus comprising at least one compensating layer selected and configured to counteract changes in the transmissivity of the pellicle upon exposure to EUV radiation.

It has been found that the transmissivity of a pellicle changes upon exposure to EUV radiation. The change may be irreversible. The change may be rapid upon exposure to EUV or the extent of the change may be dependent on the length of time which the pellicle is exposed to the EUV radiation as well as the power level used. The change in transmissivity may be caused by a number of factors. For example, certain materials used in pellicles oxidize when subjected to the sometimes harsh temperatures in an EUV lithography apparatus. The oxides produced during use of the pellicle may be volatile, such as silicon oxide or carbon monoxide/dioxide. As such, these gaseous oxides may leave the pellicle and the pellicle will reduce in thickness over time which will lead to an increase in the transmissivity of the pellicle. In contrast, certain oxides will remain on the pellicle and these may have lower transmissivity than the unoxidized form of the material. The change in transmissivity may also be caused by erosion or etching of material from the pellicle during use with or without oxidation.

Previously, changes in transmissivity of a pellicle during use and the limitation to the lifetime of the pellicle have either been accepted as inevitable or attempts have been made to prevent oxidation of materials comprising the pellicle by including oxidation-resistant materials in the pellicle. The compensating layer may be sacrificed by being removed from the pellicle or by being physically changed whilst remaining as part of the pellicle. As such, the compensating layer may be a sacrificial layer.

The seventh aspect takes a different approach to the prior art by seeking to balance the change in transmissivity of one material in the pellicle by including another material which displays the opposite change in transmissivity upon exposure to EUV radiation.

Desirably, the at least one compensating layer comprises a material which alters upon exposure to EUV radiation to increase or decrease the transmissivity of the at least one compensating layer.

The at least one compensating layer is configured so that the change in transmissivity of the at least one compensating layer mirrors the change in transmissivity of the pellicle so that the overall transmissivity of the pellicle is substantially constant. It will be appreciated that the transmissivity of the pellicle will not be completely constant indefinitely as the compensating layer will ultimately be completely sacrificed. Even so, the presence of the compensating layer which is selected and configured to counteract the change in transmissivity of the pellicle will extend the operating lifetime of the pellicle.

The compensating layer may comprises one or more of silicon dioxide, silicon, silicon nitride, silicon carbide, carbon, boron carbide, ruthenium dioxide, boron, zirconium boride, and molybdenum. The compensating layer may comprise any material which is able to withstand the conditions within an EUV lithography apparatus and which alter their transmissivity upon exposure to EUV radiation.

Boron, zirconium boride, and molybdenum have been found to show decreased EUV transmissivity upon exposure to EUV radiation. Without wishing to be bound by scientific theory and for the sake of an example, boron may be oxidized when exposed to the operating conditions of an EUV lithography apparatus to yield boron oxide. Boron oxide has much greater EUV absorption than boron, so the creation of boron oxide on a pellicle will result in a lower transmissivity. As such, these materials may be used to counteract a gain in EUV transmissivity.

On the other hand, silicon dioxide, silicon, silicon nitride, silicon carbide, carbon, boron carbide, and ruthenium dioxide have been found to show increased EUV transmissivity upon exposure to EUV radiation. Again, without wishing to be bound by scientific theory and for the sake of an example, carbon may be oxidized to form carbon monoxide or carbon dioxide. Both of these compounds are gaseous under the operating conditions of an EUV lithography apparatus and so leave the pellicle. Over time, the reduction in material will lead to an increase in the transmissivity of the pellicle.

Therefore, it is possible to provide a compensating layer on a pellicle to take account of the tendency of the materials of the pellicle to increase or decrease EUV transmissivity on use. The thickness of the compensating layer may be adjusted so that it provides a sufficiently thick oxide layer to counteract or compensate for the loss of material of the pellicle, or so that it is thick enough to provide enough material which is able to leave the pellicle to counteract the decrease in transmissivity of the pellicle over the lifetime of the pellicle.

According to an eighth aspect, there is provided a method of controlling changes in the transmissivity of an EUV pellicle, the method comprising the steps of: providing at least one layer which has increased transmissivity upon exposure to EUV radiation and/or at least one layer which has decreased transmissivity upon exposure to EUV radiation.

It has been surprisingly realized that it is possible to control the transmissivity of a pellicle during use in an EUV lithography apparatus by providing at least one layer, which may be referred to as a compensating layer, that has increased or decreased (as appropriate) transmissivity upon exposure to EUV radiation and/or the operating conditions of an EUV lithography apparatus. Previously, attempts were made to prevent physical changes in the pellicle, such as oxidation or etching, in order to prevent degradation of the pellicle. In contrast, the method according to the eighth aspect solves the problem of the varying transmissivity of a pellicle by providing a compensating layer.

According to a ninth aspect, there is provided a method of designing a pellicle for a lithography apparatus, the method comprising the steps of: measuring the change in transmissivity of a pellicle upon exposure to EUV radiation, and using the measured change in transmissivity to select one or more materials having a change in transmissivity upon exposure to EUV radiation which most closely mirrors the change in transmissivity of the pellicle for inclusion in an updated pellicle. Once selected, the material comprising the compensating layer may be added to a pellicle, thus forming a pellicle comprising the identified material.

This method allows a pellicle to be produced which has a more stable transmissivity upon use than previous pellicles. The change in transmissivity of a pellicle or materials which may serve as a compensating layer can be measured routinely by known techniques and apparatus. Therefore, it is possible to measure how the transmissivity of the pellicle changes over time and then match it to a material which displays the opposite change, so that when the pellicle and the material are combined to form an updated pellicle, the two will cancel one another out and the transmissivity of the pellicle will be more constant than the original pellicle.

The change in transmissivity of the pellicle upon exposure to EUV radiation may be measured over a preselected length of time. The preselected length of time is approximately the same order of time that the pellicle is in use in an EUV lithography apparatus.

Since a pellicle will desirably withstand use in an EUV lithography machine for at least a day and desirably longer, the measurement of the change in transmissivity will be measured over a time period which is of the same order of magnitude as the expected life of the pellicle. In this way, the change in transmissivity of the pellicle over time can be determined and the sacrificial compensating layer can be more accurately selected. For example, the preselected period of time may be between 1 and 24 hours, but may be up to seven days, if required.

The change in transmissivity of the pellicle upon exposure to EUV radiation may be measured at a preselected temperature and/or power level. The temperature and/or power level may be approximately the same temperature and/or power level to which the pellicle is exposed during use in an EUV lithography apparatus.

In order to provide a suitable model of the change in transmissivity of a pellicle, it is necessary to subject the pellicle to the conditions in which it will be used. This allows the most appropriate compensating layer to be selected for inclusion in the updated pellicle. For example, the pellicle may be tested at temperatures from around 400° C. up to around 900° C. For example, the pellicle may be tested at power levels of from around 50 W to around 500 W.

Once an updated pellicle comprising the sacrificial compensating layer has been provided, it may be subject to further testing to determine how the transmissivity of the updated pellicle changes over time under the conditions inside an EUV lithography apparatus. Based on this further information, the updated pellicle can then be refined and improved by adjusting the compensating layer, such as, for example, by altering the thickness, position, and/or composition of the compensating layer. This refinement can be repeated until an optimized pellicle is reached.

According to a tenth aspect, there is provided a pellicle designed according to the methods of the eighth or ninth aspects.

A pellicle according to the tenth aspect will demonstrate improved stability with respect to EUV transmissivity than other pellicles.

According to an eleventh aspect, there is provided a method of manufacturing a membrane assembly for EUV lithography, the method comprising: providing a stack comprising: a planar substrate, wherein the planar substrate comprises an inner region and a border region around the inner region; at least one membrane layer; an oxide layer between the planar substrate and the at least one membrane layer; and at least one further layer between the planar substrate and the at least one membrane layer; and selectively removing the inner region of the planar substrate, such that the membrane assembly comprises: a membrane formed at least from the at least one membrane layer; and a border holding the at least one membrane layer, the border comprising at least a portion of the planar substrate, the at least one further layer, and the oxide layer situated between the border and the at least one membrane layer.

It has been noted that some membrane layers are susceptible to weakening during manufacture due to over etching. Different etching processes etch different materials at different rates. As such, in certain etching processes, one material may be etched at a different rate to another material. Furthermore, during etching, it has been found that certain portions of a given layer may be etched at a different rate to other portions of the same layer. In particular, the edge portions of a given layer are generally etched at a faster rate than the central portion of the given layer. Without wishing to be bound by scientific theory, it is believed that the etchant fluid may become diluted by the etch product more in the region of the central portion of a given layer than at the edge portions of the same layer. As such, the rate of etching is reduced adjacent the central portion of a given layer when compared to the edge portions of the same layer, which results in a non-uniform etch. The degree of non-uniformity defines the minimum thickness of the layers being etched and is ultimately translated into a lack of uniformity in the ultimate membrane assembly. This non-uniformity can weaken the membrane layer and result in premature failure of the membrane layer in use or require more frequent replacement of a pellicle comprising the stack than would otherwise be the case.

According to the method of the eleventh aspect, the presence of at least one further layer between the planar substrate and the at least one membrane layer may serve to reduce or overcome the problem of over-etching. The at least one further layer is desirably etched at a considerably slower rate than the oxide layer. Desirably, the at least one further layer is substantially resistant to the etchant used to etch the oxide layer. As such, during a step of bulk etching of the planar substrate, the etching process proceeds to etch away the inner region of the planar substrate until it reaches the oxide layer, which may be referred to as a buried oxide layer. The etchant used to etch away the inner region of the planar substrate may be a tetramethylammonium hydroxide (TMAH) based etchant or other suitable etchant as known in the art that selectively etches silicon over silicon oxide. The oxide layer is substantially resistant to the etchant used to etch away the inner region of the planar substrate and therefore the etching process is stopped or slowed down considerably upon reaching the buried oxide layer. Since the etchant will not etch away or only very slowly etch away the buried oxide layer, means that there is less risk of over etching of the buried oxide layer. Following this, an etchant which is able to etch away the buried oxide layer is used to remove at least a portion of the buried oxide layer. Suitable etchants include buffered oxide etchants (BOE), as are known in the art. The etchant used etches the at least one further layer more slowly than the oxide layer and so any over etching of the buried oxide layer does not translate into the at least one further layer. Since the buried oxide layer is thin, only a short etch is required to remove the buried oxide layer, which reduces the likelihood of the overlying at least one further layer being unevenly etched. A second etch step using TMAH etchant or other suitable etchant which selectively etches silicon over silicon oxide may then be used to remove the at least one further layer. Again, since the oxide layer which overlies the at least one further layer is resistant to the etchant used to etch away the at least one further layer, the risk of over etching is reduced and the resulting stack comprises a more uniform oxide layer on the lower face of the at least one membrane layer.

A further advantage of the eleventh aspect is that it allows the buried oxide layer between the planar substrate and the at least one membrane layer to be thinner. This reduces the tendency of the membrane assembly to wrinkle, which can weaken the membrane assembly, since oxide layers comprise compressive stresses and therefore having a thinner oxide layer reduces the compressive stresses within the stack.

Desirably, the at least one membrane layer comprises molybdenum silicon nitride, although it will be appreciated that embodiments of the present invention can be applied to any membrane layer, such as, for example, pSi. The at least one membrane layer can be any of the membrane layers described in respect of any aspect. For example, the membrane layer may comprise nitridated metal silicide or silicon. Molybdenum silicon nitride is sensitive to over etching using buffered oxide etch (BOE), which comprises HF. Again, without wishing to be limited by scientific theory, it is believed that when overlying silicon dioxide sacrificial layers are removed that the silicon nitride in the molybdenum silicon nitride is also etched, thereby creating notches which weaken the layer. If the etching step is continued for too long, the entire layer could be damaged or destroyed. An embodiment of the present invention serves to overcome this problem.

Desirably, the at least one further layer comprises silicon. Desirably, the at least one further layer comprises cSi or pSi or aSi. Silicon is etched faster than silicon oxide in TMAH etchant, whereas silicon oxide is etched faster than silicon in BOE. As such, it is possible to selectively remove either a silicon layer or a silicon oxide layer without etching an overlying silicon oxide layer or a silicon layer, respectively.

There may be a further oxide layer, which may be a thermal oxide layer between the at least one further layer and the at least one membrane layer. As such, the order of the layers in the stack starting from the top may be a membrane layer, a thermal oxide layer, a silicon layer, a buried oxide layer, and a planar substrate. The membrane layer may be capped with a layer of tetraethyl orthosilicate (TEOS), which may be converted to a silicon oxide layer.

The planar substrate may comprise silicon. Silicon is a well-characterized material that is able to withstand the harsh environment within a lithographic apparatus in use.

The step of removing the inner region of the planar substrate may comprise etching using TMAH etchant. The stack may be exposed to the etchant until the etchant reaches the buried oxide layer.

A different etchant, for example BOE, may then be used to remove the buried oxide layer. The different etchant may be used until the etchant reaches the at least one further layer, which may comprise silicon.

A further etching step using TMAH etchant may then be used to etch away the at least one further layer. The etchant may be used until the etchant reaches the thermal oxide layer.

According to a twelfth aspect, there is provided a membrane assembly for EUV lithography, the membrane assembly comprising: a membrane formed from at least one layer comprising molybdenum silicon nitride; and a border holding the membrane; wherein the border region is formed from a planar substrate comprising an inner region and a border region around the inner region, wherein the border is formed by selectively removing the inner region of the planar substrate, wherein the assembly comprises a buried oxide layer, a silicon layer, and a thermal oxide layer between the border and the membrane.

The membrane assembly according to the twelfth aspect comprises a thermal oxide layer which is thinner than the thermal oxide layer of other assemblies. Since the thermal oxide is compressive, this can cause the membrane layer to wrinkle. By having a thinner oxide layer, the compressive forces are reduced and the wrinkling of the membrane is also reduced. In addition, the etching of the thermal oxide is more uniform, which results in more uniform transmission of radiation through the assembly.

Desirably, the planar substrate comprises silicon.

The assembly manufactured in accordance with the eleventh aspect or according to the twelfth aspect may be used as a pellicle, desirably in an EUV lithography apparatus.

According to a thirteenth aspect, there is provided a method of preparing a stack comprising the steps of: providing a planar substrate, a membrane layer, and a tetraethyl orthosilicate layer and annealing the stack, wherein the tetraethyl orthosilicate layer includes boron such that at least a portion of the boron from the tetraethyl orthosilicate layer diffuses into the membrane layer during annealing.

Membrane layers, such as those comprising pSi and molybdenum silicon nitride are susceptible to over-etching, which can reduce the strength of the layer and result in premature failure. It is desirable to prevent over etching and this may be achieved by adding additional sacrificial layers which serve as etch homogenization layers, as described above. Alternatively or additionally, it has been surprisingly found that it is possible to make such membrane layers more resistant to etching by adding boron to the layers. It has been found that the addition of boron to silicon reduces the etch rate in TMAH by a factor of around 100. Without wishing to be bound by scientific theory, it is believed that the boron preferentially sits at the grain boundaries in the membrane layer. It is also believed that pellicles are especially sensitive to etchant at the grain boundaries and so the presence of boron at the grain boundaries is believed to be the reason why the resulting films are more etch resistant.

It has been found that the addition of boron to the TEOS layer and subsequent annealing causes boron to diffuse into the membrane layer. For molybdenum silicide and molybdenum silicon nitride membranes, this has been found to increase the consistency in the physical properties of membrane assemblies made from stacks according to this aspect, namely there are fewer weak assemblies. In addition, it is possible to produce larger membrane assemblies and the resulting membrane assemblies perform in heat loading tests similarly to membrane assemblies which do not include boron.

In addition, pSi layers manufactured according to this method are at least around 50% stronger than similar layers not including boron. Indeed, the samples tested did not fail at the limit of the testing apparatus (3 GPa), so the exact limit of the increase in strength has yet to be defined. In addition, there is no reduction in the EUV transmissivity of such membranes comprising boron. In addition, the emissivity of pSi membranes manufactured according to this method is much higher than for pSi membranes which do not include boron. This increased emissivity is beneficial as it makes the performance of any metallic caps less critical and may even allow the emissive metallic cap to be eliminated.

The planar substrate may comprise any suitable material. Desirably, the planar substrate comprises silicon.

The membrane layer may comprise any suitable material. Desirably, the membrane layer comprises at least one of silicon, molybdenum silicide and molybdenum silicon nitride.

The annealing may be carried out at any suitable temperature. The temperature at which TEOS is annealed is known in the art. Desirably, the annealing is carried out at a temperature of from around 400 to around 1000° C. For example, the annealing may take place at 600° C., 700° C., 800° C., or 900° C., as well as intermediate temperatures. The annealing may take place at a constant temperature or may take place at a variable temperature.

The tetraethyl orthosilicate layer may comprise from about 0.1 to about 15 wt % boron, desirably from about 2 to about 10 wt % boron, and more desirably from about 4 to about 8 wt % boron.

The TEOS layer may be provided by chemical vapor deposition or any other suitable technique.

According to a fourteenth aspect, there is provided a stack comprising a planar substrate and a membrane layer, wherein the membrane layer is doped with boron.

The planar substrate may comprise silicon.

The membrane layer may at least partially surround the planar substrate. The membrane layer may comprise at least one of silicon, molybdenum silicide, molybdenum silicon nitride or any other membrane layer material described herein.

The stack may further comprise a thermal oxide layer between the planar substrate and the membrane layer.

The stack may further comprise a boron-containing TEOS layer at least partially surrounding the membrane layer. The boron-containing TEOS layer is desirably in contact with the membrane layer to allow the boron atoms to diffuse into the membrane layer.

The stack manufactured according to the method of the thirteenth aspect or the stack according to the fourteenth aspect may be used in any of the other methods described herein or in the manufacture of an assembly according to any aspect. For example, the stack according to the fourteenth aspect may be used in the method of the twelfth aspect. Boron doping of a membrane layer is applicable to all aspects of the present invention.

As detailed above, the features described in respect of any of the aspects may be combined with the features described in respect of any of the other aspects of the present invention. For example, the features of the pellicle according to the second aspect may be combined with the features of the first, third, fourth, and/or fifth aspects. In addition, the pellicles according to the second aspect may be designed by the method according to the ninth aspect. All combinations of aspects of the present invention may be combined with one another, except where the features of the aspects of the invention are mutually exclusive.

In summary, the methods allow for the manufacture of a pellicle, in particular a molybdenum silicide pellicle or a silicon pellicle, which has been nitridated in order to improve its physical characteristics. The resulting pellicle is suitable for use in lithographic apparatus, such as, for example, an EUV lithography apparatus. It has not been previously possible to manufacture such a pellicle. The pellicles manufactured according to the methods are able to resist the high temperatures achieved when the pellicle is in use and also resist attack by free radical species or other reactive species. The methods allow for pellicles with a surface area of up to 10 cm by 14 cm in size. The methods also allow for the design and manufacture of a pellicle which displays improved stability in the context of EUV transmissivity upon use in an EUV lithography machine. A pellicle comprising a compensating layer would extend the life of a pellicle and would reduce the change in transmissivity of the pellicle over its lifetime and therefore allow a consistent number of wafers to be imaged in a given time period.

Embodiments of the present invention will now be described with reference to an EUV lithography apparatus. However, it will be appreciated that the present invention is not limited to pellicles and is equally applicable to spectral purity filters.

BRIEF DESCRIPTION OF THE DRAWINGS

Embodiments of the invention will now be described, by way of example only, with reference to the accompanying schematic drawings, in which.

DETAILED DESCRIPTION

Figure 1:
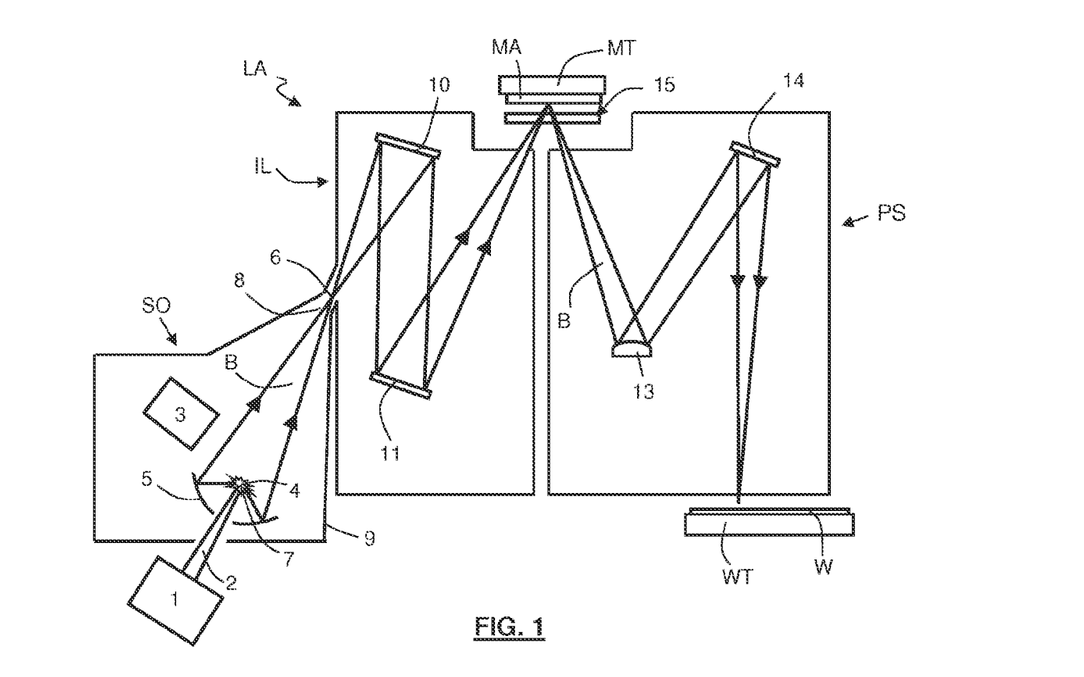
FIG. 1 depicts a lithographic system comprising a lithographic apparatus and a radiation source according to an embodiment of the invention.

FIG. 1 shows a lithographic system including a pellicle 15 according to the first aspect or manufactured according to the methods of the second aspect according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W. In this embodiment, the pellicle 15 is depicted in the path of the radiation and protecting the patterning device MA. It will be appreciated that the pellicle 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation. Indeed, the spectral filter may be a pellicle according to any aspect of the present invention.

Figure 2:
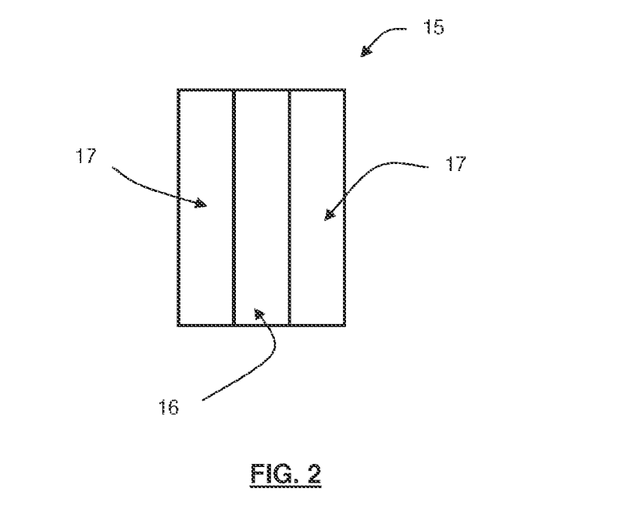
FIG. 2 depicts a schematic view of a pellicle according to an embodiment of the present invention and manufactured by the methods of an embodiment of the present invention.

FIG. 2 shows a schematic depiction of a pellicle in accordance with the an embodiment of the present invention. The pellicle 15 comprises a metal-silicide-nitride or nitridated silicon layer 16 sandwiched between capping layers 17.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Figure 3A:
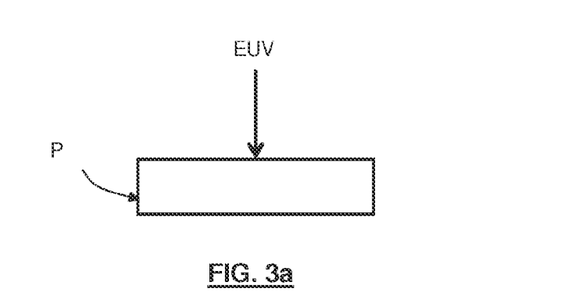
FIGS. 3a to 3c depict a schematic of the steps used in selecting the correct compensating layer for a given pellicle.
Figure 3B:
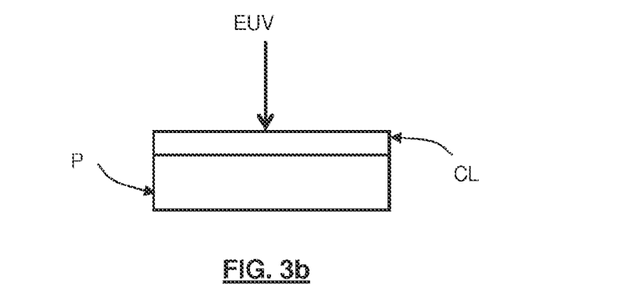
Figure 3C:
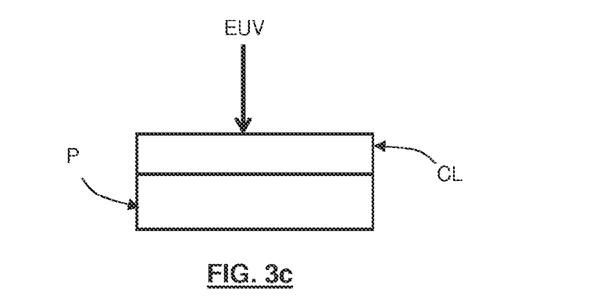

FIGS. 3a to c shows a schematic of the steps used in selecting the correct compensating layer for a given pellicle. A pellicle P is subjected to the conditions in a lithography apparatus and the change in transmissivity of the pellicle P is measured. The pellicle P is shown as being comprised of a single layer in the schematic drawings, but this is for the sake of simplicity and it will be appreciated that the pellicle P may comprise a pellicle stack. As such, the pellicle P may comprise one or more layers. Once the change in transmissivity of a given pellicle P has been measured, the measured change is transmissivity is used to select a compensating layer CL material which most closely displays the opposite change in transmissivity. This information is then used to create an updated pellicle P comprising the compensating layer CL. The updated pellicle may then undergo the same testing to refine the nature of the compensating layer CL. As shown in FIG. 3c, the compensating layer CL has been increased in thickness, but it will be appreciated that this is not the only change which is possible and other possible changes include providing a thinner compensating layer CL, moving the compensating layer to a different part of the pellicle P, or even changing the material comprising the compensating layer CL.

As an example, a $MoSiN_x$ pellicle was exposed to EUV radiation for 20 hours at 580° C. under a pressure of 3 Pa of hydrogen and it was found that the transmissivity of the pellicle increased by around 1%. It is believed that this is due to the surface being terminated with silicon oxynitride that is susceptible to photonic etching and thereby becoming thinner. Another $MoSiN_x$ pellicle was coated with a layer of boron and tested at around 540° C. under a pressure of 3 Pa of hydrogen for 20 hours. This resulted in around a 1% decrease in the transmissivity of the pellicle. As such, the boron layer counteracted the changes in transmissivity caused by the etching of the silicon oxynitride. Thus, the thickness of the boron layer could be altered in order to result in a thinner layer of boron oxide being formed such that the change in transmissivity of the pellicle was closer to 0%.

Figure 4:
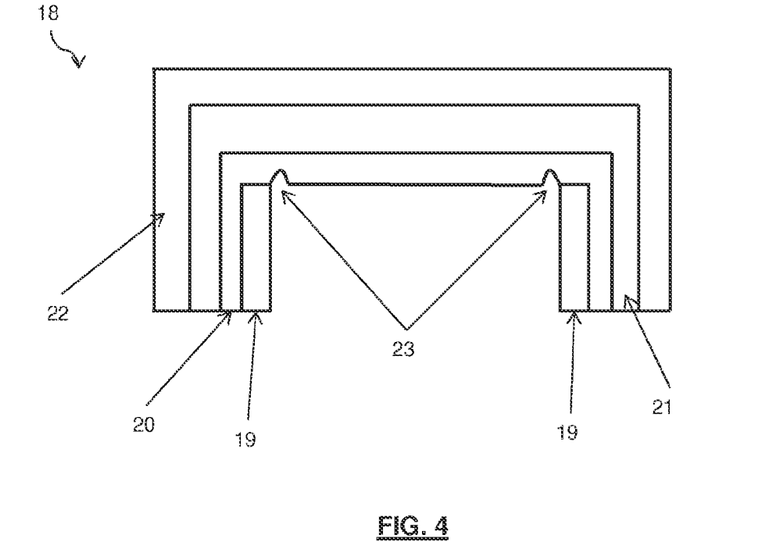
FIG. 4 depicts a schematic cross-section of a membrane assembly manufactured according to a method.

FIG. 4 depicts a cross-section of a membrane assembly manufactured in accordance with an existing method. The membrane assembly 18 comprises a border 19 which is manufactured from a planar substrate. Any suitable planar substrate may be used, but a silicon border will be discussed herein. A thermal oxide layer 20 is provided on the border 19. In the example, the thermal oxide layer 20 is a silicon oxide layer. A membrane layer 21 is provided on the oxide layer 20. The membrane layer 21 comprises molybdenum silicon nitride, although other materials may be used. A TEOS layer 22 is provided on the membrane layer 21. The TEOS layer may subsequently be processed to form a silicon oxide layer. Alternatively, instead of thermal oxide or TEOS, layers 20 and/or 22 may be a SiN layer having a thickness up to 10 nm, for example in a range from 1 to 5 nm.

During manufacture, a TMAH based etchant is used to etch away the inner region of the planar substrate. In order to ensure that the required amount of the planar substrate has been removed, the etching step is allowed to proceed for long enough that the etchant begins to etch away at the thermal oxide layer. Although the TMAH based etchant etches silicon oxide at a lower rate than silicon, due to the need to ensure that the inner region of the planar substrate, the etching continues and notches are formed around the edge of the thermal oxide layer. The etching step may take more than an hour, and the over etching can take place for around a minute. As such, in order to ensure that the etchant does not etch into the membrane layer, the thermal oxide layer needs to be relatively thick, which may be 50 nm or more. Since the thermal oxide layer is compressive, this may induce wrinkling of the membrane, which can weaken the assembly. In addition, the additional thickness of the thermal oxide layer may result in lower EUV transmissivity of the membrane assembly.

Figure 5A:
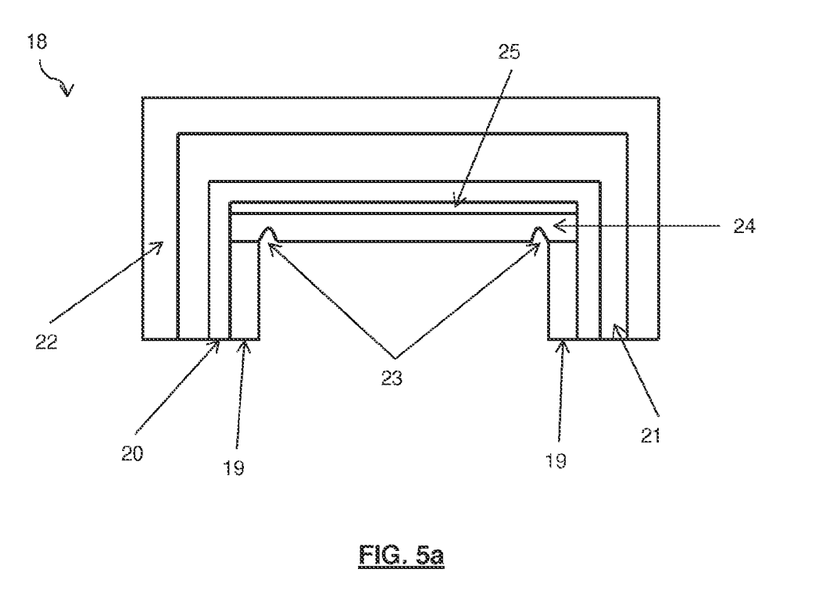
FIGS. 5a to 5c depict a schematic cross-section of a membrane assembly manufactured according to a method according to the eleventh aspect.

FIG. 5a depicts a schematic cross section of a membrane assembly manufactured according to an embodiment of the present invention. FIG. 5a depicts the membrane assembly at an early stage of manufacture. The same numerals are used for the features corresponding to those in FIG. 4. In contrast to the membrane assembly of FIG. 4, the membrane assembly 18 depicted in FIG. 5a additionally comprises a buried oxide layer 24 and a further layer 25 located between the border 19 and the membrane layer 21. The further layer 25 may be a silicon layer.

During manufacture, as with the method depicted in FIG. 4, a TMAH etchant is used to bulk etch the inner region of the planar substrate to provide a border 19. The buried oxide layer 24 serves the same purpose as the thermal oxide layer 20 in FIG. 4 in that it resists the etchant used to etch the silicon from the inner region of the planar substrate. As shown in FIG. 5a, this will result in notches 23 being formed around the edge of the buried oxide layer 24.

Figure 5B:
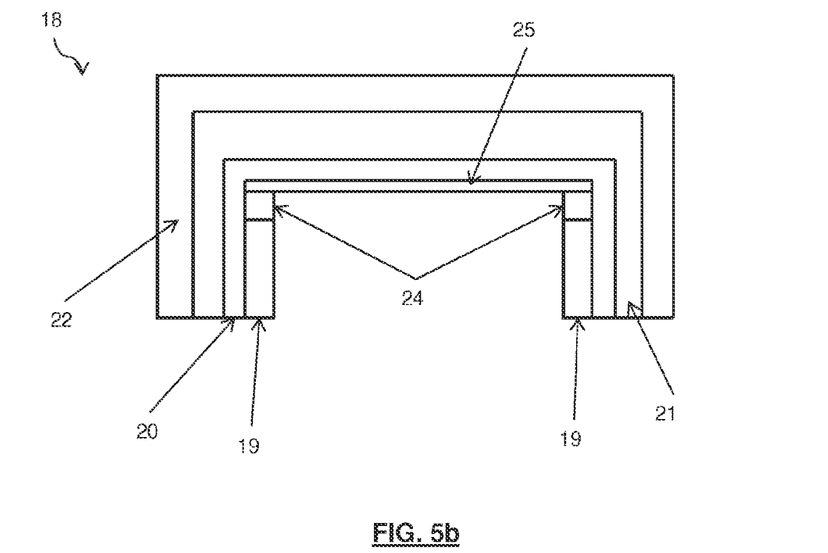

In a following step shown in FIG. 5b, a different etchant, such as BOE, is used to remove an inner portion of the buried oxide layer 24. Since the overlying further layer 25 comprising silicon is resistant to etching by BOE, the over etch of the buried oxide layer 24 is not transferred to the further layer 25. In this way, these layers serve as etch homogenization layers.

Figure 5C:
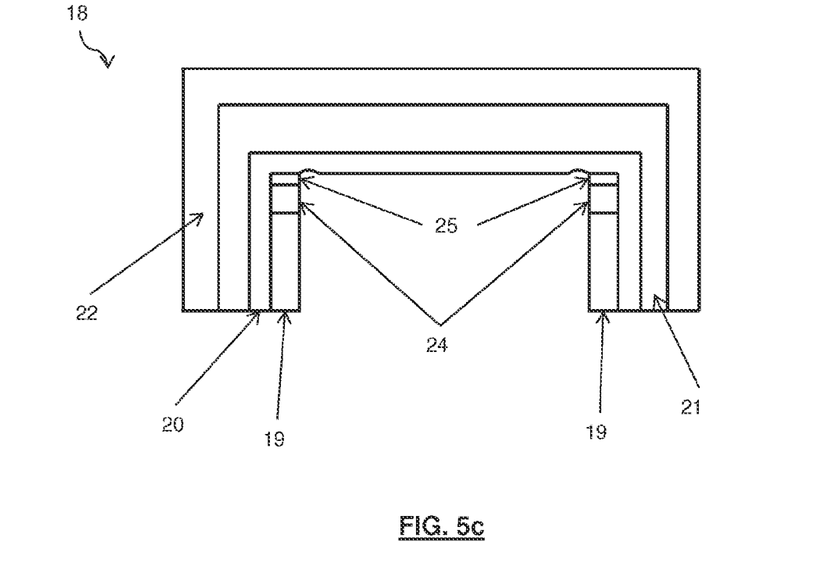

Subsequently, as shown in FIG. 5c, a further etching step may be carried out in which an etchant, such as TMAH etchant, is used to remove the inner region of the further layer 25. Since the further layer 25 is much thinner than the planar substrate, the time to which the thermal oxide layer 20 is exposed to etchant is reduced from more than one hour to a few minutes. This drastically reduces the potential for over etching of the thermal oxide layer 20 since the potential over etching only lasts a few seconds and thereby allows the thermal oxide layer 20 to be thinner than would be the case in the existing method of manufacture. For example, the thermal oxide thickness could be reduced from 50 nm or more to less than 50 nm.

The buried oxide layer and the thermal oxide layer may be produced in the same way or different ways and the exact method of producing these layers is not particularly limiting. The membrane layer may comprise multiple layers. For example, the membrane layer may comprise a molybdenum silicon nitride layer sandwiched between two molybdenum silicide layers.

The method according to the eleventh aspect provides for a membrane assembly in which over-etching is reduced, resulting in a stronger and more consistent membrane assembly. This method also reduces the stress mismatch between layers of the membrane assembly as sacrificial oxide layers can be made thinner without the risk of over etching. This reduces compressive forces on the assembly and reduces the risk of wrinkling. In addition, since the planar substrate, buried oxide layer and overlying silicon layer can be provided as a silicon-on-insulator type wafer (SOI), this can reduce the number of manufacturing steps prior to etching, which may reduce costs and the risk of particulate contamination.

The membrane assemblies may be used as pellicles, desirably in EUV lithography machines, but can also find application as spectral purity filters.

Figure 6:
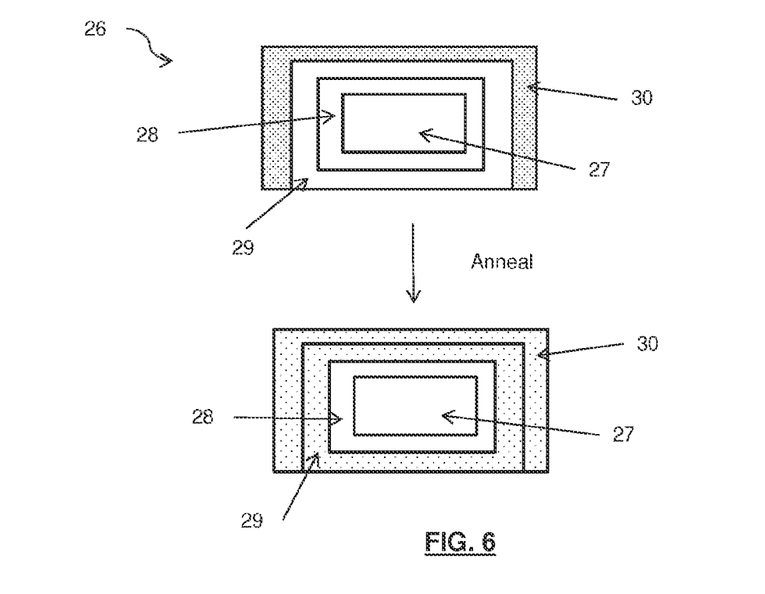
FIG. 6 depicts a schematic of a method according to the thirteenth aspect.

FIG. 6 schematically depicts the method according to the thirteenth aspect. There is provided a stack 26 comprising a planar substrate 27, an optional thermal oxide layer 28 at least partially surrounding the planar substrate 27, a membrane layer 29 at least partially surrounding the thermal oxide layer 28, and a boron-doped TEOS layer 30. Prior to annealing the membrane layer 29 is substantially free of boron. The pattern in boron-doped layer 30 is intended to indicate the presence of boron atoms in the layer and how this passes into the membrane layer 29 after annealing.

In an annealing step, the stack is heated to a temperature sufficient to allow boron in the boron-doped TEOS layer 30 to diffuse into the membrane layer 29. This results in a boron-enriched membrane layer 29 and a reduction in the amount of boron in the boron-doped TEOS layer 30. It will be appreciated that not all of the boron may diffuse into the membrane layer 29, and the exact amount of boron which diffuses into the membrane layer 29 can be controlled by adjusting the temperature and duration of the annealing step, as well as the concentration of the boron in the boron-doped TEOS layer 30. The membrane layer may comprise at least one of silicon, molybdenum silicide, and molybdenum silicon nitride.

The boron-doped membrane containing assemblies are eminently suitable for use as pellicles in EUV lithography machines as well as use as spectral purity filters.

Embodiments are provided according to the following clauses:

1. A pellicle for a lithographic apparatus, wherein the pellicle comprises nitridated metal silicide or nitridated silicon.
2. A pellicle according to Clause 1, wherein the nitridated metal silicide has the formula $M_x(Si)_yN_z$, wherein $x \leq y \leq 2x$, and $0 < z \leq x$, or wherein the nitridated silicon has the formula $SiN_a$, wherein $0.01 \leq a \leq 1$, desirably wherein $a \leq 0.5$, more desirably wherein $a \leq 0.1$.
3. A pellicle according to Clause 2, wherein $1 \leq x \leq 5$.
4. A pellicle according to Clause or Clause 3, wherein $z \leq 1$.
5. A pellicle according to any of Clauses 2 to 4, wherein $y = 2x$.
6. A pellicle according to any of Clauses 1 to 5, wherein metal M is selected from the group comprising Ce, Pr, Sc, Eu, Nd, Ti, V, Cr, Zr, Nb, Mo, Ru, Rh, La, Y, and Be.
7. A pellicle according to Clause 5, wherein metal M is zirconium, molybdenum, and/or beryllium.
8. A pellicle according to any of Clauses 1 to 6, wherein the atomic concentration of nitrogen in the metal-silicide-nitride or nitridated silicon is less than around 25%, less than around 20%, less than around 15%, less than around 10%, less than around 5%, or less than around 1%.
9. A pellicle according to any of Clauses 1 to 8, wherein the pellicle further comprises at least one capping layer.
10. A pellicle according to Clause 9, wherein the pellicle comprises a capping layer on either side of the metal-silicide-nitride or nitridated silicon.
11. A pellicle according to any of Clauses 1 to 10 wherein the metal-silicide-nitride or nitridated silicon is from around 10 to around 40 nm thick, desirably from around 15 to around 30 nm thick.
12. A pellicle according to any of Clauses 9 to 10, wherein the at least one capping layer is around 0.1 to around 100 nm thick, desirably around 1 nm to around 5 nm thick.
13. A pellicle according to any of Clauses 9 to 12, wherein the capping layer comprises ruthenium, boron, metal boride, boron carbide, and/or boron nitride.

14. A method of manufacturing a pellicle for a lithographic apparatus, the method comprising nitriding a metal silicide or silicon substrate.
15. A method according to Clause 14, wherein the nitriding comprises sputtering a metal silicide or silicon substrate with a plasma, desirably a nitrogen-containing plasma.
16. A method according to Clause 14 or Clause 15, wherein the metal silicide or silicon substrate is a metal silicide or silicon film.
17. A method according to any of Clauses 14 to 16, wherein the plasma comprises a mixture of argon and nitrogen.
18. A method according to Clause 17, wherein the ratio of argon to nitrogen is variable.
19. A method according to Clause 18, wherein the ratio of argon to nitrogen is in the range of from around 5% nitrogen up to around 45% nitrogen.
20. A method according to any of Clauses 1 to 19, where the metal is selected from the group comprising Ce, Pr, Sc, Eu, Nd, Ti, V, Cr, Zr, Nb, Mo, Ru, Rh, La, Y, and Be.
21. A method according to Clause 20, wherein the metal is zirconium, molybdenum, and/or beryllium.
22. A method according to any of Clauses 14 to 21, wherein the substrate comprises silicon, desirably monocrystalline silicon.
23. A pellicle for a lithographic apparatus obtainable or obtained by the method according to any of Clauses 14 to 22.
24. Use of a pellicle manufactured by the method according to any of Clauses 14 to 22 or a pellicle according to any of Clauses 1 to 13 in a lithographic apparatus.
25. Use of reactive sputtering to manufacture a pellicle according to any of Clauses 1 to 13.
26. An assembly for a lithographic apparatus comprising a pellicle according to any of Clauses 1 to 13, a frame for supporting the pellicle and a patterning device attached to the frame.
27. A pellicle for a lithographic apparatus comprising at least one compensating layer selected and configured to counteract changes in the transmissivity of the pellicle upon exposure to EUV radiation.
28. A pellicle according to Clause 27, wherein the at least one compensating layer comprises a material which alters upon exposure to EUV radiation to increase or decrease the transmissivity of the at least one sacrificial layer.
29. A pellicle according to Clause 27 or Clause 28, wherein the at least one compensating layer comprises one or more of silicon dioxide, silicon, silicon nitride, silicon carbide, carbon, boron carbide, ruthenium dioxide, boron, zirconium boride, and molybdenum.
30. A method of controlling changes in the transmissivity of an EUV pellicle, the method comprising the steps of: providing at least one layer which has increased transmissivity upon exposure to EUV radiation and/or at least one layer which has decreased transmissivity upon exposure to EUV radiation.
31. A method of designing a pellicle for a lithography apparatus, the method comprising the steps of: measuring the change in transmissivity of a pellicle upon exposure to EUV radiation, and using the measured change in transmissivity to select one or more materials having a change in transmissivity upon exposure to EUV radiation which most closely mirrors the change in transmissivity of the pellicle for inclusion in an updated pellicle.
32. A method according to Clause 31, wherein the change in transmissivity of the pellicle upon exposure to EUV radiation is measured over a preselected length of time.
33. A method according to Clause 32, wherein the preselected length of time is approximately the same order of time that the pellicle is in use in an EUV lithography apparatus.
34. A method according to any of Clauses 31 to 33, wherein the change in transmissivity of the pellicle upon exposure to EUV radiation is measured at a preselected temperature and/or power level.
35. A method according to Clause 34, wherein the temperature and/or power level is approximately the same temperature and/or power level to which the pellicle is exposed during use in an EUV lithography apparatus.
36. A method according to any of Clauses 31 to 35, wherein the change in transmissivity of the updated pellicle upon exposure to EUV radiation is measured, and the measured change in transmissivity is used to determine whether further changes to the one or more materials included in the updated pellicle are required.
37. A method according to Clause 36, wherein the method is repeated one or more times to provide a pellicle which substantially maintains its transmissivity upon use in an EUV lithography apparatus.
38. A pellicle designed according to the method of any of Clauses 30 to 37.
39. A method of manufacturing a membrane assembly for EUV lithography, the method comprising:
    providing a stack comprising:
        a planar substrate, wherein the planar substrate comprises an inner region and a border region around the inner region; at least one membrane layer; an oxide layer between the planar substrate and the at least one membrane layer; and at least one further layer between the planar substrate and the at least one membrane layer; and
    selectively removing the inner region of the planar substrate, such that the membrane assembly comprises:
        a membrane formed at least from the at least one membrane layer; and a border holding the at least one membrane layer, the border comprising at least a portion of the planar substrate, the at least one further layer, and the oxide layer situated between the border and the at least one membrane layer.
40. A method according to Clause 39, wherein the at least one further layer is selected to be etched at a considerably slower rate than the oxide layer.
41. A method according to Clause 39 or Clause 40, wherein the inner region of the planar substrate is selectively removed by an etchant, wherein the etchant is selected to preferentially etch silicon over silicon oxide, desirably wherein the etchant is a tetramethyl ammonium hydroxide (TMAH) etchant.
42. A method according to Clause 41, wherein subsequent to the etching of the inner region of the planar substrate, a different etchant selected to preferentially etch silicon oxide over silicon is used to etch at least a portion of the oxide layer, desirably wherein the etchant selected is a buffered oxide etchant.
43. A method according to Clause 42, wherein subsequent to the etching of the oxide layer, a different etchant selected to preferentially etch silicon over silicon oxide is used to etch at least a portion of the at least one further layer, desirably wherein the at least one further layer comprises silicon, and desirably wherein the etchant is a tetramethyl ammonium hydroxide (TMAH) etchant.

44. A method according to any of Clauses 39 to 43, wherein the at least one membrane layer comprises at least one of pSi, molybdenum silicide, or molybdenum silicon nitride.

45. A method according to any of Clauses 39 to 44, wherein the at least one further layer comprises silicon.

46. A method according to any of Clauses 39 to 45, wherein a further oxide layer is provided between the at least one further layer and the at least one membrane layer.

47. A method according to any of Clauses 39 to 46, wherein the membrane layer is capped with a tetroethyl orthosilicate (TEOS) layer, optionally wherein the TEOS layer contains boron.

48. A method according to any of Clauses 39 to 47, wherein the planar substrate comprises silicon.

49. A membrane assembly for EUV lithography, the membrane assembly comprising: a membrane formed from at least one layer comprising molybdenum silicon nitride; and a border holding the membrane; wherein the border region is formed from a planar substrate comprising an inner region and a border region around the inner region, wherein the border is formed by selectively removing the inner region of the planar substrate, wherein the assembly comprises a buried oxide layer, a silicon layer, and a thermal oxide layer between the border and the membrane.

50. A membrane assembly according to Clause 49, wherein the planar substrate comprises silicon.

51. A method of preparing a stack comprising the steps of: providing a planar substrate, a membrane layer, and a tetraethyl orthosilicate layer and annealing the stack, wherein the tetraethyl orthosilicate layer includes boron such that at least a portion of the boron from the tetraethyl orthosilicate layer diffuses into the membrane layer during annealing.

52. A method according to Clause 51, wherein the membrane layer comprises at least one of silicon, molybdenum silicide, and molybdenum silicon nitride.

53. A method according to Clause 51 or Clause 52, wherein the planar substrate comprises silicon.

54. A method according to any of Clauses 51 to 53, wherein the annealing takes places at a temperature of from around 400 to around 1000° C.

55. A method according to any of Clauses 51 to 54, wherein the tetraethyl orthosilicate layer comprises from about 0.1 to about 15 wt % boron, desirably from about 2 to about 10 wt % boron, and more desirably from about 4 to about 8 wt % boron.

56. A stack comprising a planar substrate and a membrane layer, wherein the membrane layer is doped with boron.

57. A stack according to Clause 56, wherein the planar substrate comprises silicon.

58. A stack according to Clauses 56 or Clause 57, wherein the membrane layer comprises at least one of silicon, molybdenum silicide, or molybdenum silicon nitride.

59. A stack according to any of Clauses 56 to 58, wherein the stack further comprises a thermal oxide layer between the planar substrate and the membrane layer.

60. A stack according to any of Clauses 56 to 59, wherein the stack further comprises a boron-containing TEOS layer at least partially surrounding the membrane layer.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A spectral filter membrane for a lithographic apparatus, the spectral filter membrane comprising nitridated metal silicide.

2. The spectral filter membrane according to claim 1, wherein the nitridated metal silicide has the formula $M_x(Si)_yN_z$, wherein each of x, y and z is greater than zero.

3. The spectral filter membrane according to claim 2, wherein the formula of the nitridated metal silicide has stoichiometric or non-stoichiometric values.

4. The spectral filter membrane according to claim 1, wherein the metal M is selected from: Ce, Pr, Sc, Eu, Nd, Ti, V, Cr, Zr, Nb, Mo, Ru, Rh, La, Y, or Be.

5. The spectral filter membrane according to claim 1, wherein the atomic concentration of nitrogen in the metal-silicide-nitride is less than around 25%.

6. The spectral filter membrane according to claim 1, further comprising at least one capping layer.

7. The spectral filter membrane according to claim 6, wherein the at least one capping layer is from 0.1 nm to 10 nm thick.

8. The spectral filter membrane according to claim 1, comprising molybdenum silicon nitride.

9. The spectral filter membrane according to claim 1, wherein a layer comprising the nitridated metal silicide is from 10 to around 40 nm thick.

10. A membrane assembly for a lithographic apparatus, the membrane assembly comprising:
the spectral filter membrane according to claim 1, and
a border holding the spectral filter membrane.

11. The membrane assembly according to claim 10, comprising a thermal oxide layer, a buried oxide layer or a silicon layer between the border and the spectral filter membrane.

12. A spectral filter assembly for an EUV lithographic apparatus, the spectral filter assembly comprising:
the spectral filter membrane according to claim 1, and
a frame configured to support the spectral filter membrane.

13. A spectral filter membrane for a lithographic apparatus, the spectral filter membrane comprising at least one compensating layer selected and configured to counteract changes in transmissivity of the spectral filter upon exposure to EUV radiation.

14. The spectral filter membrane according to claim 13, wherein the at least one compensating layer comprises a material which alters upon exposure to EUV radiation to increase or decrease the transmissivity of the at least one compensating layer.

15. The spectral filter membrane according to claim 14, wherein the at least one compensating layer comprises one or more selected from: silicon dioxide, silicon, silicon nitride, silicon carbide, carbon, boron carbide, ruthenium dioxide, boron, zirconium boride, or molybdenum.

16. A method of manufacturing a spectral filter membrane for a lithographic apparatus, the method comprising nitriding a metal silicide substrate to form a metal-silicide-nitride layer for the spectral filter membrane.

17. The method according to claim 16, comprising nitriding a molybdenum silicide substrate.

18. The method according to claim 16, wherein when silicon is being partially nitridated, the formula of the material comprising the membrane has non-stoichiometric values.

19. The method according to claim 16, further comprising:
  providing a stack comprising:
    a planar substrate, wherein the planar substrate comprises an inner region and a border region around the inner region; and
    at least one membrane layer;
  selectively removing the inner region of the planar substrate, so as to provide:
    the spectral filter membrane formed at least from the at least one membrane layer; and
    a border holding the at least one membrane layer, the border comprising at least a portion of the planar substrate.

20. The method according to claim 19, further comprising annealing at a temperature of from 400 to 1000° C.

* * * * *